United States Patent
Kanda et al.

(12) 
(10) Patent No.: US 6,211,606 B1
(45) Date of Patent: Apr. 3, 2001

(54) PIEZOELECTRIC ACTUATOR AND METHOD FOR MANUFACTURING SAME

(75) Inventors: Torahiko Kanda; Hirofumi Nakamura; Tsutomu Kagami, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/244,418

(22) Filed: Feb. 4, 1999

(30) Foreign Application Priority Data

Feb. 5, 1998 (JP) .................................................. 10-024610

(51) Int. Cl.$^7$ .................................................. H01L 41/08
(52) U.S. Cl. ............................................. 310/328; 310/367
(58) Field of Search .................................. 310/328, 366, 310/367, 334

(56) References Cited

U.S. PATENT DOCUMENTS

| Re. 35,011 | * | 8/1995 | Wersing et al. | ........................ 310/334 |
| 5,421,071 | * | 6/1995 | Kanegae et al. | ..................... 29/25.35 |
| 5,942,837 | * | 8/1999 | Reuter | ................................... 310/328 |

FOREIGN PATENT DOCUMENTS

| 0 402 171 | * | 12/1990 | (EP) | ..................................... 310/328 |
| 60-90770 | | 5/1985 | (JP) | ................................... B41J/3/04 |
| 3-10845 | | 1/1991 | (JP) | ................................. B41J/2/045 |
| 4-86265 | | 3/1992 | (JP) | ................................... B41J/2/16 |
| 6-218921 | | 8/1994 | (JP) | ................................. B41J/2/045 |
| 6-226974 | | 8/1994 | (JP) | ................................. B41J/2/045 |
| 8-80614 | | 3/1996 | (JP) | ................................... B41J/2/16 |
| 8-118623 | | 5/1996 | (JP) | ................................. B41J/2/045 |
| 8-156272 | | 6/1996 | (JP) | ................................... B41J/2/16 |
| 8-279631 | | 10/1996 | (JP) | ............................ H01L/41/083 |
| 9-11482 | | 1/1997 | (JP) | ................................... B41J/2/16 |
| 9-254385 | | 9/1997 | (JP) | ................................. B41J/2/045 |

\* cited by examiner

Primary Examiner—Thomas M. Dougherty
(74) Attorney, Agent, or Firm—Sughrue, Mion, Zinn, Macpeak & Seas, PLLC

(57) ABSTRACT

Disclosed herein is a piezoelectric actuator comprising a plurality of driving columns separated by grooves in which the width of each driving column in the direction of the groove width widens from the displacement output surface to the substrate. The widening of the diving column width toward the substrate realizes a piezoelectric actuator having a high strength and a high reliability capable of stably and effectively generating an output displacement.

7 Claims, 12 Drawing Sheets

PIEZOELECTRIC ACTUATOR AND METHOD FOR MANUFACTURING SAME

BACKGROUND OF THE INVENTION (a) Field of the Invention

The present invention relates to a piezoelectric actuator and a method for manufacturing the same, and more in particular to a piezoelectric actuator employed in an ink jet type recording apparatus mounted in a printer, a facsimile, a copier and the like and having high strength and reliability, and a method for manufacturing the same.

(b) Description of the Related Art

In an ink jet printer (hereinafter referred to as an ink jet recording apparatus), a piezoelectric actuator is usually employed in an ink head for ejecting ink. A conventional piezoelectric actuator is disclosed in JP-A-8(1996)-156272 and JP-A-8(1996)-118623. The conventional piezoelectric actuator will be described referring to the annexed drawings and reciting JP-A-8(1996)-156272.

FIG. 1A and FIG. 1B are perspective views showing the respective steps of a process of manufacturing a conventional piezoelectric actuator. In order to manufacture the conventional piezoelectric actuator, at first, a pair of piezoelectric element plates 28 are bonded to a substrate 14 along electrode patterns 26, 27 (refer to FIG. 1A).

Then, slits having a required pitch in the direction perpendicular to the longitudinal direction of the piezoelectric element plates 28 are formed on the piezoelectric element plate 28 and on the surface of the substrate 14 to make piezoelectric element rows 31 consisting of a plurality of piezoelectric elements (driving column) 29, 30 for separating the electrode patterns 26, 27 into individual electrodes 33 corresponding to each of the piezoelectric elements 29 (refer to FIG. 1A).

Edge electrodes (external electrodes) made by connecting every other internal electrode are formed on the both edge surfaces of the piezoelectric elements 29, 30 of the respective piezoelectric element rows 31. One external electrode on the edge surface is connected to the common electrode which the internal electrode on the substrate through the electroconductive material, and the other edge electrode is connected to the individual electrode 33 on the substrate through the electroconductive material. A support member 34 is bonded of which a height is nearly the same as those of the piezoelectric elements 29,30 on the periphery of the piezoelectric elements 29,30. The layered piezoelectric elements 29,30 outputs the displacement in the direction the same as that of the layers by means of the piezoelectric effect.

FIGS. 2A, 2B and 2C are a perspective view, a plan view and a side elevation view showing the state of the above piezoelectric element plate 28 taken out with the substrate 14, respectively. Conventionally, slit-like grooves 37 are formed in the direction perpendicular to the longitudinal direction of the piezoelectric element plate 28 to form a plurality of piezoelectric elements. Each piezoelectric element 29,30 is a long and narrow rectangle so that a pressure chamber formed thereby has a long and narrow shape. The displacement output surface 36a of each piezoelectric element 29,30 has the active region 36b formed by the crossing between the layers of the common electrode 32 and the individual electrode 33 which are the internal electrode and the inactive electrode extending to the side surface of the piezoelectric actuator connected to the external power and having either of the common electrode 32 or the individual electrode 33.

The output displacement produced on the active region 36b has a problem such that the output displacement decreases or becomes unstable because the displacement is restricted by the inactive region 36c. Since the slit-like grooves are formed by a dicing process using a thin cutting blade, the sectional shape of the groove is nearly rectangular, and a crack or a cutting due to bending is likely to occur at the corners of the groove bottom surface or the bottom parts of each piezoelectric elements 29,30. A further problem arises that the cost of manufacturing the piezoelectric actuator is high because the groove processing and the formation of the external electrode require a high cost.

It is necessary, in view of the above situation, to realize a piezoelectric actuator for an ink jet recording apparatus capable of generating an output displacement at high efficiency and stability by employing a shape having a narrowed part and a tapered part to elevate the strength and the reliability of a driving column in place of the rectangular displacement output surface and its rectangular section. It is also necessary to realize a piezoelectric actuator having excellent productivity by decreasing a processing cost of the slit-like groove separating and forming the piezoelectric actuator and of the external electrode.

SUMMARY OF THE INVENTION

It is therefore an object of the present invention to provide a piezoelectric actuator having high strength and reliability and being capable of generating an output displacement at high efficiency and stability in order to elevate the productivity, and a method for manufacturing the same.

The present invention provides a piezoelectric actuator comprising a substrate and a plurality of driving columns extending parallel to one another and separated by grooves on the substrate, the driving column having an active region on the central part in the direction of the groove, which is formed by a layered electrode structure including common electrode layers and individual electrode layers alternately layered employing green sheets made of piezoelectric material, and a displacement output surface externally outputting the displacement produced by the piezoelectric effect of the active region on the upper surface of the driving column opposite to the substrate, the width of each driving column in the direction of the groove width widening from the displacement output surface to the substrate.

The present invention also provides a method for manufacturing a piezoelectric actuator having a substrate and a plurality of driving columns extending parallel to one another and separated by grooves on the substrate comprising: a step of applying electrode paste on one surface of a green sheet made of piezoelectric material to form an internal electrode, layering and pressing a plurality of green sheets having an internal electrode on the substrate and forming a layered electrode member on the substrate by sintering, a step of forming a mask having a plurality of slit-like empty patterns on the upper surface of the layered electrode member, forming slit-like grooves on the layered electrode member by blasting ground particles from the mask to the upper surface of the layered electrode member to form a plurality of driving columns having the layered electrode layer on the substrate separated with one another by means of the groove, and a step of forming on the side surface of the driving column an external electrode electrically connected with the internal electrode.

In accordance with the present invention, the strength of the bottom part of the driving column can be elevated compared with that of a conventional piezoelectric actuator having a rectangular driving column sectional shape, and the anti-cutting strength due to bending of the driving column can be also elevated. The scattering of the direction of generation of the displacement can be reduced to stabilize the output displacement.

PREFERRED EMBODIMENTS OF THE INVENTION

In the present invention, a common electrode layer is electrodes to which a common potential is applied, and an individual electrode layer is electrodes to which different potentials are applied.

Now, the present invention will be more specifically described with reference to accompanying drawings.
Embodiment 1

Figure 1A:
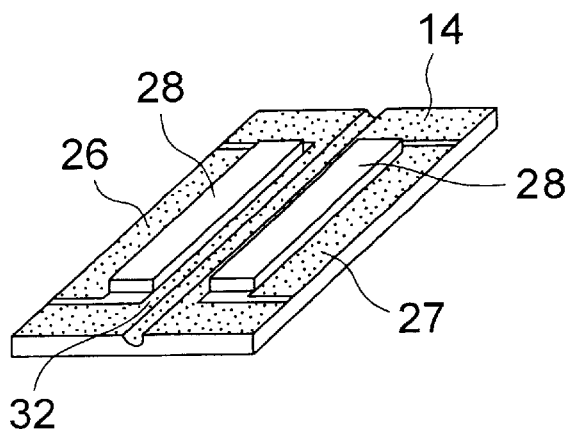
FIGS. 1A and 1B are perspective view showing two steps of manufacturing a conventional piezoelectric actuator.
Figure 1B:
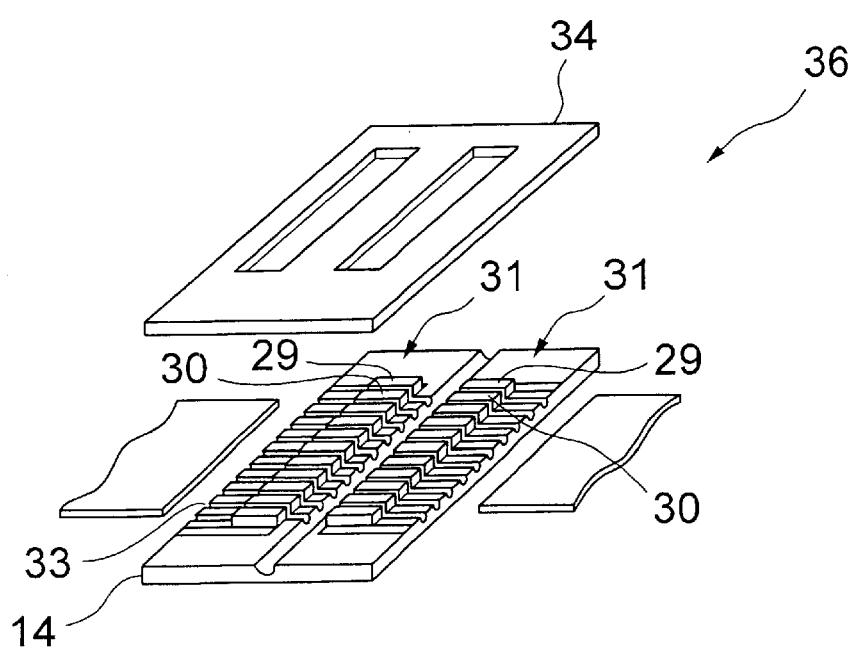
Figure 2A:
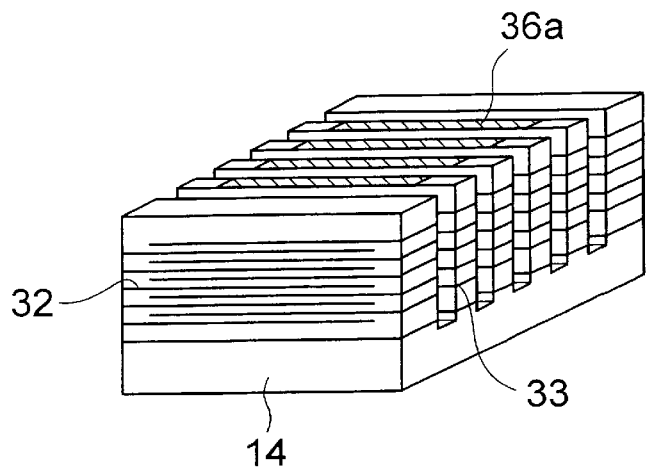
FIGS. 2A, 2B and 2C are a perspective view, a plan view and a side elevation view showing the state of the above piezoelectric element plate taken out with the substrate, respectively.
Figure 2B:
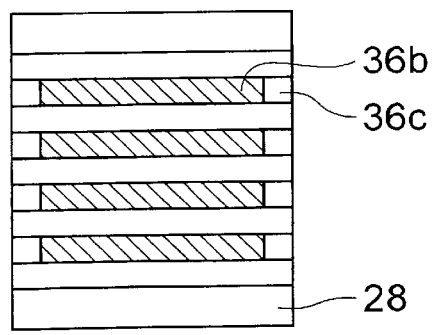
Figure 2C:
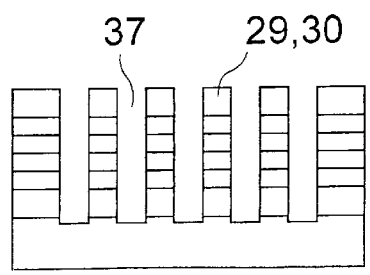
Figure 3A:
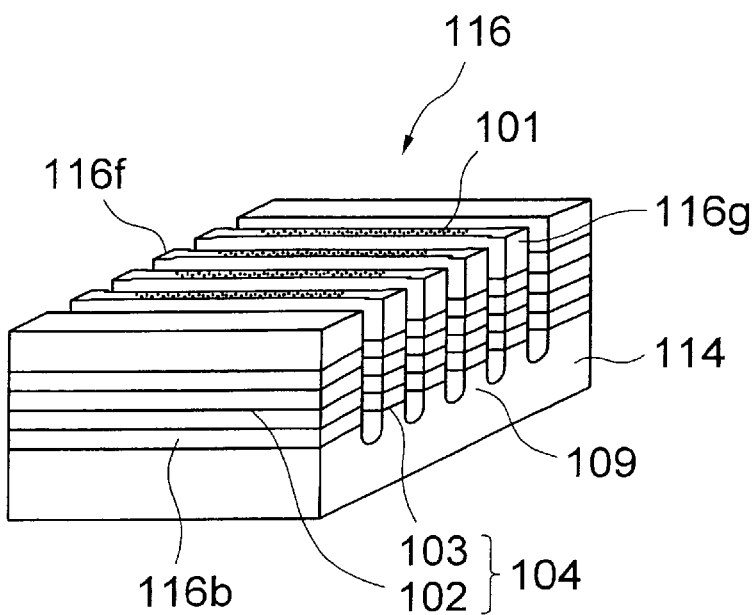
FIGS. 3A and 3B are a perspective view and a plan view of a piezoelectric actuator of the present Embodiment employed in an ink jet head, respectively.
Figure 3B:
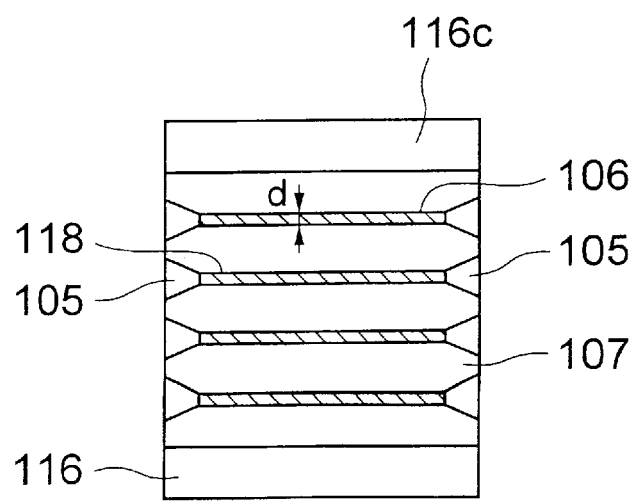
Figure 4A:
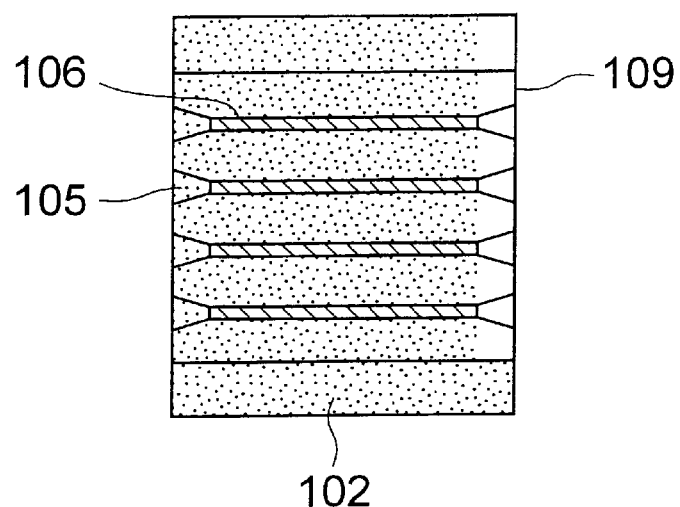
FIGS. 4A and 4B are plan views showing applying patterns when a common electrode and an individual electrode, are formed, respectively.
Figure 4B:
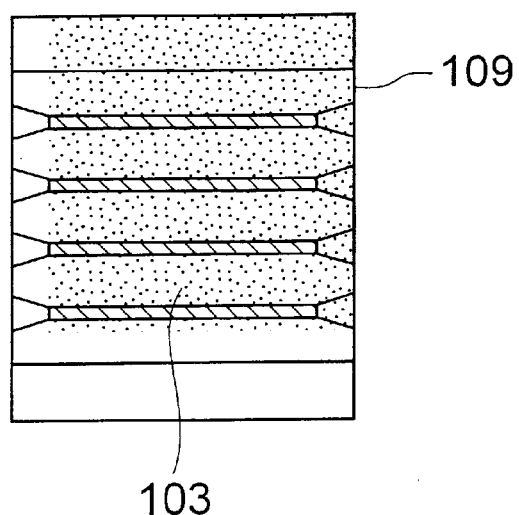

The present Embodiment is an embodiment of a piezoelectric actuator and of a method for manufacturing the same in accordance with the present invention FIGS. 3A and 3B are a perspective view and a plan view of a piezoelectric actuator of the present Embodiment employed in an ink jet head, respectively. FIGS. 4A and 4B are plan views showing applying patterns of electroconductive materials when forming a common electrode and an individual electrode, respectively. In the present Embodiment, the description of the same element as that of the above conventional piezoelectric actuator 36 will be omitted by affixing the same numeral thereto.

A piezoelectric actuator 116 of the present Embodiment has four long and narrow driving columns 108 parallel with one another which expand and contract in the vertical direction and have a displacement output surface 101 on the respective upper surfaces. The respective driving columns 108 are parallel positioned to one another on a substrate 114 through grooves 107, which function as a piezoelectric driving mechanism. The width (d) of the driving column 108 gradually widens from the displacement output surface 101 to the bottom of the driving column 108.

The driving column 108 has, on the central region of the driving column section in the direction of the groove, an active region 106 formed by a layered electrode structure comprising a common electrode 102 and an individual electrode 103 layered with one another via a green sheet 116b made of piezoelectric material. The driving column 108 further has the displacement output surface 101, which outputs displacement to outside by means of the piezoelectric effect of the active region 106, on the upper surface of the driving column opposite to the substrate 14. The column width of the respective driving columns 108 in the direction of the groove width widens from the displacement output surface 101 to the substrate 4.

One of the two edge regions of the driving column 108 in the direction of the groove is formed as a layered common electrode layer 116f formed by the common electrode layers 116g only, and the other is formed as a layered individual electrode layer 116g formed by the individual electrode layers only. The respective edge regions function as an inactive region 105. On the whole outer surface of the layered common electrode layer 116f is applied electroconductive material for conducting the respective common electrodes 102. The outer part of the layered individual electrode layer 116g is formed as an external electrode extracting surface 109 having an external electrode 115 (refer to FIG. 6) which is connected to the respective individual electrodes of the driving columns and an FPC cable 125 (refer to FIG. 8A) which is connected to the respective common electrodes.

The transversal sectional shape of the driving column 108 is long and narrow along the groove and has the narrowest width at the central part in the longitudinal direction of the driving column 108 functioning as the active region 106 and the edge regions of the driving columns 108 functioning as the inactive region continuous with the central part and widening towards the longitudinal edge. The width of the active region 106 is 0.12 mm, the longitudinal length of the active region 106 is 1.6 mm, the pitch is 0.34 mm, and the height is about 0.6 mm. The transversal sectional shape of the inactive region 105 is a taper-like one of which a width gradually widens towards the outer part.

The piezoelectric actuator 116 has a peripheral column 116c parallel to the driving column 108 on the outside of the driving column 108.

Then, a method for manufacturing the above piezoelectric actuator 116 will be described. The piezoelectric actuator 116 was manufactured by layering a sheet applied thereon the common electrode 102 made of electroconductive material, a sheet applied thereon the individual electrode 103 and a sheet having no electrode on a green sheet (not shown) made of piezoelectric material.

A total of 10 sheets consisting of the five sheets applied thereon the common electrode 102 and the five sheets applied thereon the individual electrode 103 were layered alternately to produce nine active layers, and the structure was formed in which displacement in the direction the same as the layered direction produced according to the vertical piezoelectric effect was taken out.

Then, four sheets containing no internal electrode 104 and 20 sheets containing no internal electrode 104 were layered on the upper and the lower surfaces of the group of the sheet layers containing the internal electrode 104.

The number of the sheets having the internal electrode 104 may be increased or decreased depending on the desired thickness of the piezoelectric actuator 116 and the degree of the output displacement. Although, in the present Embodiment, the green sheet consisting of lead zirconate-titanate based ceramics which is piezoelectric material and an organic binder, an ordinarily employed strong dielectric material or the like can be used as the piezoelectric material. The green sheet may be manufactured employing a doctor blade method to have a thickness of about 50 micronmeters, but the sheet thickness may be controlled depending on the desired output displacement. Although the internal electrode 104 applied on the green sheet was formed employing silver-palladium paste and by means of a screen printing method, it can be formed employing a vapor deposition method or the like using another electroconductive metal.

As a result of layering the sheets, the active region 106 which was formed by the overlapping between the common electrode 102 and the individual electrode 103 on the displacement output surface 101, when observed from the displacement output surface as shown in FIGS. 3 and 4. The inactive region 105 formed by overlapping between the displacement output surface and either of the common electrode 102 or the individual electrode 103 was formed and extended from the boundary with the active region 106 to the taken-out surface 109 of the external electrode. The inactive region side surface of the individual electrode is made to be the external electrode taken-out surface 109, and the common electrode 102 pattern is made to be "L" shaped as shown in FIG. 4A. A part of the common electrode 102 was exposed to the external electrode taken-out surface 109, and the electric connection to the individual electrode 103 of each driving column 108 and to the whole common electrode 102 of the driving column 108 for applying the driving electrode to one surface of the external electrode taken-out surface was realized.

After the layered member 116d was formed by layering a required number of sheets as mentioned above, the layered member 16d was thermally bonded and unified. Since a plenty of an organic binder was contained in the layered member 116d, the binder was at first removed and then the layered member was calcined 1100° C. In order to finish the piezoelectric actuator having a desired thickness compared with the calcined layered member 116d, the both surfaces were lapped and the periphery thereof was polished by employing a dicing saw to obtain required dimensions. The periphery polishing was conducted for the purpose of exposing the edge surface of the internal electrode at the external electrode taken-out surface 109 of the driving column 108 for surely obtaining the electric interconnection with the external electrode 115.

Figure 5A:
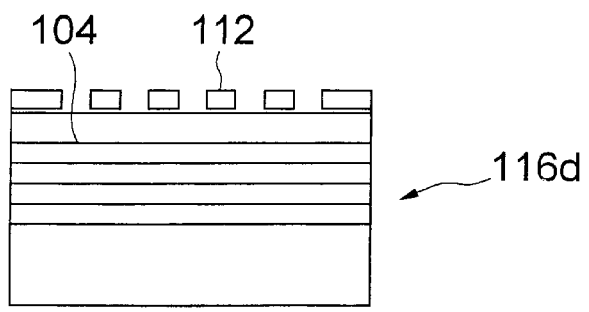
FIGS. 5A, 5B and 5C are side sectional views showing a step-wise groove processing in accordance with a sandblast method.
Figure 5B:
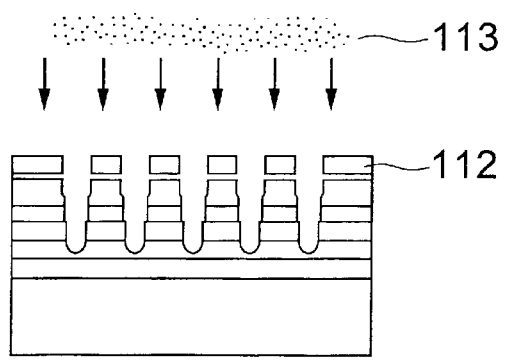
Figure 5C:
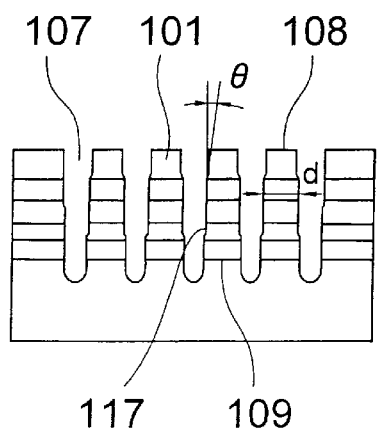

Then, the grooves 107 for forming the driving columns 108 were made in accordance with a sandblast method. FIGS. 5A, 5B and 5C are side sectional views showing a step-wise groove processing in accordance with the sandblast method.

At first, a photo mask having a removed pattern the same as the displacement output surface 101 was prepared.

Then, urethane based film-like resist (not shown) having a thickness of 50 micrometers was tightly adhered to the surface of the displacement output surface 101 of the piezoelectric actuator 116 employing a laminating apparatus.

After the above photo mask was tightly adhered to the film-like resist and was exposed to ultraviolet rays, it was developed with a weakly basic solution containing sodium carbonate at a concentration of 1% followed by the removal of unnecessary portions of the resist to form a pattern mask 112 (FIG. 5A).

After the normal baking of the pattern mask 112 was conducted at about 100° C., the layered member 116d having the pattern mask was mounted on the sandblast apparatus, and silicon carbide ground particles having a mesh size of #400 downward collide thereto. The distance between a nozzle for blasting the ground particles 113 and the surface of the piezoelectric actuator to be processed was 100 mm. The nozzle and the processed actuator were in reciprocation movement in an X-Y plane, and relative moving velocities of the nozzle to the processed actuator were 40 mm/mm and 1000 min/min in the X and Y directions, respectively.

Five grooves 107 having a top part width of the active region 106 of 0.12 mm, a length of the active region 106 in the longitudinal direction of 1.6 mm, a pitch of 0.34 mm and a depth of about 0.6 mm were processed to form four driving columns 108. The numbers of the pitch and of the driving columns 108 can be controlled to the desired numbers by changing the pattern mask 112. In the processing chamber of the sandblast apparatus, 120 piezoelectric actuators were arranged and the grooves 107 were collectively processed in about 50 minutes.

As a result, the width (d) of the driving column 108 was formed and gradually widened toward the bottom of the groove 107 as shown in FIG. 5C. The average angle ($\phi$) of a taper 117 was about 5 degree.

Figure 6:
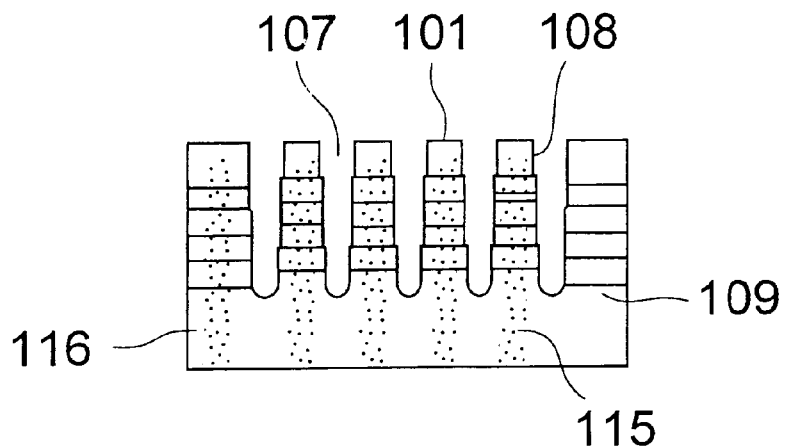
FIG. 6 is a side elevational view showing the state after an external electrode is formed.

The edge of the individual electrode which was the internal electrode corresponding to each driving column 108 was exposed at the external electrode taken-out surface 109. After the processing of the groove, an external electrode 115 was formed on the external electrode taken-out surface 109 by applying silver paste on the exposed edge to make a terminal FIG. 6 is a side elevational view showing the state after the external electrode is formed.

Figure 8A:
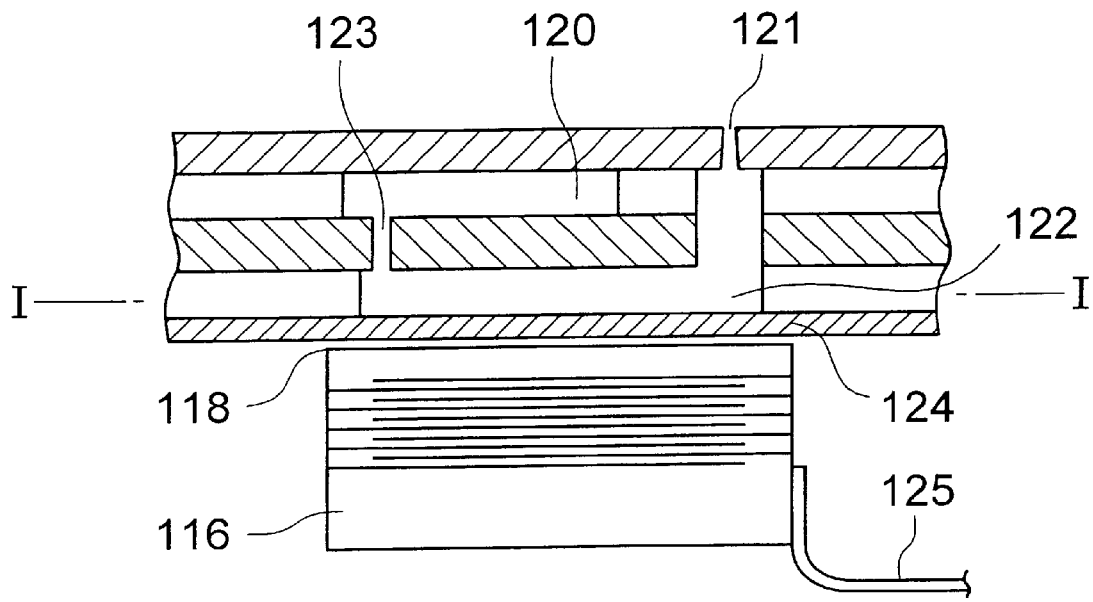
FIGS. 8A and 8B are a side sectional view showing an ink jet head and a sectional view in part taken by the line I—I of FIG. 8A, respectively.

Thereafter, an FPC cable 125 to be electrically connected to the common electrode 103 was thermally connected under pressure (refer to FIG. 8A). The pattern of the common electrode 102 was "L" shaped as shown in FIG. 4A, and the FPC cable was connected to the external electrode taken-out surface 109. It is unnecessary to form a patterned external electrode on the side surface on which the edge portion of the common electrode was exposed and which opposed to the external electrode taken-out surface 109, and the silver paste was applied on the whole surface.

In accordance with the above steps, the piezoelectric actuator 116 in which the active region 106 of the displacement output surface 101 of the driving column 108 was rectangular and the inactive region 105 had the tapered shape was manufactured. The respective voltages having a desired wave shape were applied between the individual electrode 103 of each driving column 108 and the all common electrodes 102 through the connecting terminal of the FPC cable 125 to individually drive each driving column 108.

In the present Embodiment, the planar sectional shape of the inactive region 105 was so arranged that the width of the region 105 widened toward the external electrode taken-out surface 109 to secure a broader exposed surface of the internal electrode 104 (individual electrode 103) of the driving column 108. The silver paste was easily applied when the external electrode 115 was formed, and the highly reliable interconnection was conducted when the FPC cable 125 was thermally connected under pressure. Vapor deposition of an electroconductive metal may be performed in place of the above steps for forming the external electrode 115.

Then, the operation of the piezoelectric actuator manufactured in the present Embodiment will be described.

Figure 7:
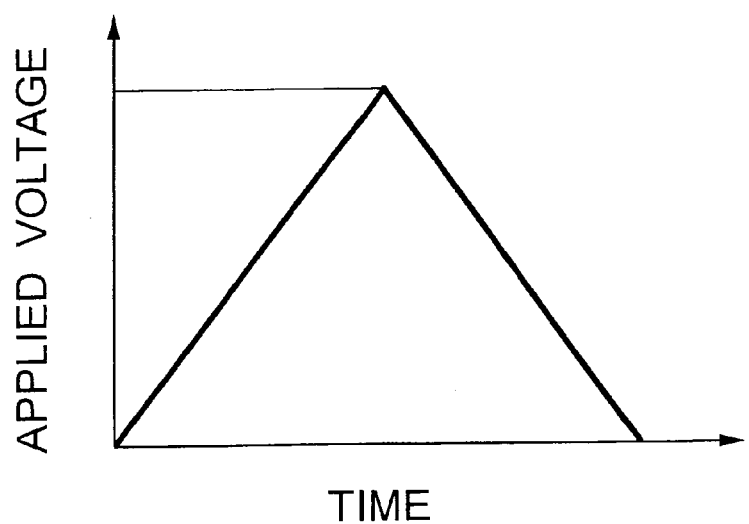
FIG. 7 is a graph showing a voltage wave shape applied between a common electrode and an individual electrode.

Voltages were applied to every driving column 108 to displace the active region 106 of the displacement output surface 101 in the layered direction of the green sheets, that is, in the direction perpendicular to the displacement output surface 101. FIG. 7 is a graph showing a voltage wave shape applied between the common electrode and the individual electrode. As a result of applying a voltage having a wave shape as shown in FIG. 7 to one driving column, the displacement of about 0.2 micrometer was observed. As a result of conducting similar experiments on the other driving columns, the same of similar output displacements were obtained.

The sectional shape of the driving column 108 perpendicular to the displacement output surface 101 was a tapered one widening toward the bottom of the groove 107. Because of this shape, the effects of decreasing the deformation due to bending in the direction (horizontal direction in FIG. 6) perpendicular to the displacement output surface 101 of the driving column 108 and of decreasing its scattering were obtained compared with the case of having a rectangular section. Accordingly, the output displacement of the green sheet in the layered direction could be more stabilized than that of a conventional one.

Figure 8B:
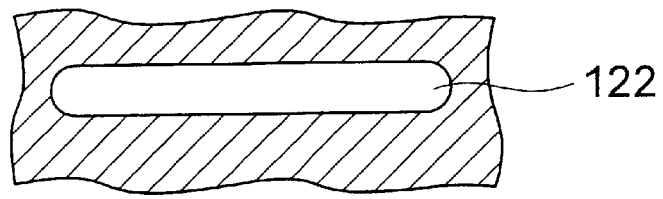

FIGS. 8A and 8B are a side sectional view showing an ink jet head and a sectional view in part taken by the line I—I of FIG. 8A, respectively.

The ink jet head consisting of an ink pool 120, a nozzle 121, a pressure chamber 22, a supply aperture 23, a vibration plate 24 and the FPC cable 25 connected to the piezoelectric actuator 116 was manufactured employing the piezoelectric actuator 116. The piezoelectric actuator 116 was bonded to the vibration plate 124 by means of an adhesive.

Then, the voltage having the voltage wave shape shown in FIG. 7 was applied to evaluate the gushing of the ink drop, and as a result the ink drops could be gushed though all the nozzles 121.

In the present Embodiment, the area of the active region 106 could be reduced to decrease an electrostatic capacity of the driving column 108 compared with a conventional one by making the planar shape of the inactive region 105 of the piezoelectric actuator 116 widening toward the external electrode taken-out surface 109. As a result, when the displacement required for the gushing of the ink drops was outputted, the current flowing in a circuit through the FPC cable 125 was reduced to suppress the consumption power compared with those of the conventional one having the rectangular displacement output surface. Because of the stabilization of the output displacement, the scattering of the ejecting characteristic of each nozzle 121 could be decreased.

Experimental Example 1 Concerning Groove Formation

Although a similar groove to the groove 107 could be formed even when alumina ground particles having a mesh size of #400 were blasted, the exfoliation and the wearing of the patterned mask 112 occurred before the groove 107 depth reached to the desired value and the driving column 108 could not be formed when the other ground particles such as calcium carbonate ground particles and spherical glass ground particles were employed. While the mesh size of the blasted ground particles 113 in Experiment 1 was #400 (the ground particle size was about 40 micronmeters), the wearing and the exfoliation of the patterned mask 112 remarkably occurred in case of the mesh size below #300 (about 60 micronmeters). A plenty of time as much as two hours was required for the processing of the groove 107 when the ground particles having a mesh size more than #800 (about 15 micronmeters) were employed. Judging from these results, it is understandable that the blasted ground particles 113 are preferably the silicon carbide particles or the alumina particles and the particle size is preferably larger than #800 and smaller than #300.

Experimental Example 2 Concerning Groove Formation

It was confirmed that the angle of the taper 117 could be changed by changing the material, the mesh size and the volume of the blasted ground particles 113.

According to the previously conducted evaluation, the stable formation of a taper having an angle of 8° or more or that of 1° or less using the sandblast method was difficult. The effect of elevating the strength of the driving column 108 was seldom obtained when the average angle of the taper 117 was 2° or less. Accordingly, the angle ($\theta$) range of the taper 117 was preferably between 2 and 80°.

Experimental Example 3 Concerning Groove Formation

A strength against shearing due to bending of the driving column 108 was evaluated. For the purpose of comparison, a driving column having a rectangular shape and having a width, a length a pitch and the like similar to those of the driving column 108 was manufactured using a dicing method, and its anti-shearing strength was evaluated. As a result, it was understandable that the strength against shearing due to bending could be increased at 50% or more by using the driving column 108 of Embodiment 1 having the sectional shape widening toward the bottom of the groove 107. It was also understandable that the time required for forming the four driving columns 108 in one piezoelectric actuator 116 in accordance with the sandblast method could be reduced to ½ or less compared with that required in the dicing method.

The driving column 108 having the shape widening toward the groove bottom as described in Embodiment 1 could be obtained even when the groove 107 was formed in accordance with the dicing method and employing a thin cutting blade having a tapered outer front edge. However, the dicing method had disadvantages such that the exchange of and the modification of the outer front edge shape of the blade were frequently required depending on the wearing of the blade, and the cost for the processing was twice or more than that of the sandblast method.

Embodiment 2

The present Embodiment is a preferred Embodiment of the present invention. In the present Embodiment, the description of the same element as that of the above Embodiment 1 will be omitted by affixing the same numeral thereto.

Figure 9A:
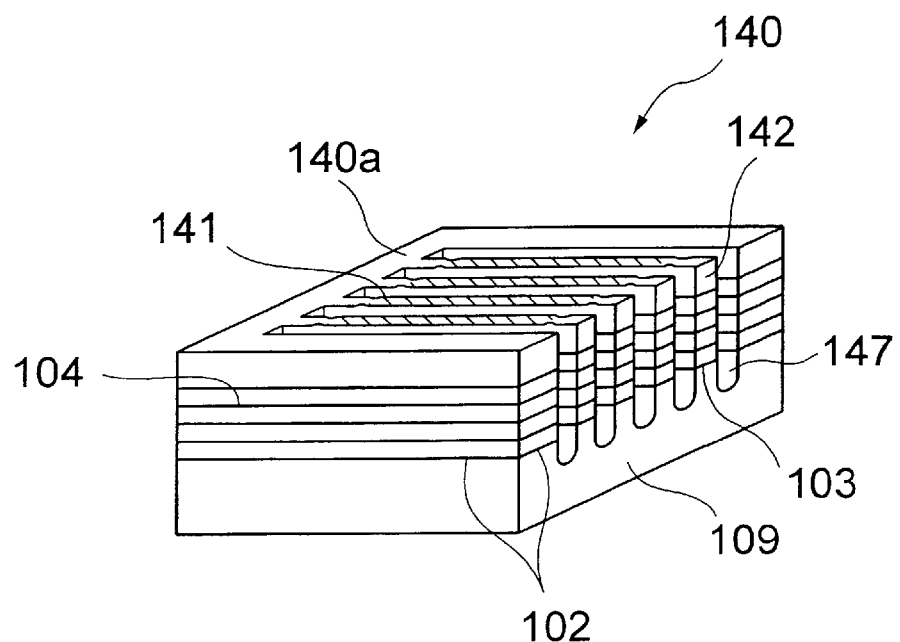
FIGS. 9A and 9B are a perspective view and a plan view showing a piezoelectric actuator of the present Embodiment, respectively.
Figure 9B:
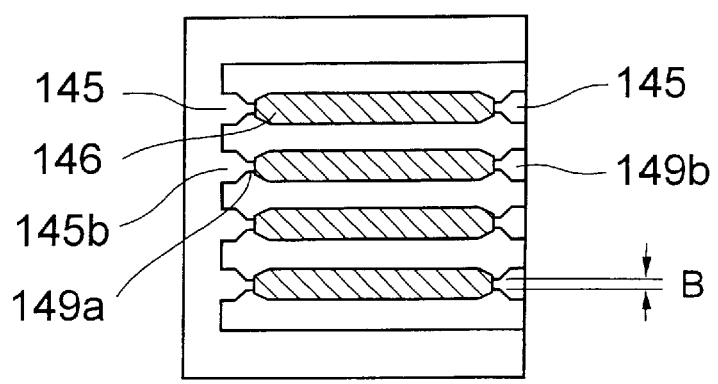
Figure 10A:
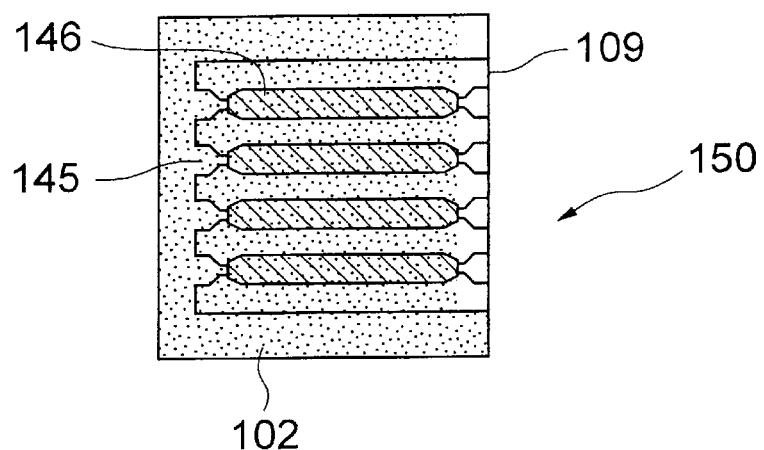
FIGS. 10A and 10B are horizontal sectional views showing the shapes of a common electrode and an individual electrode of a layered member 150, respectively.
Figure 10B:
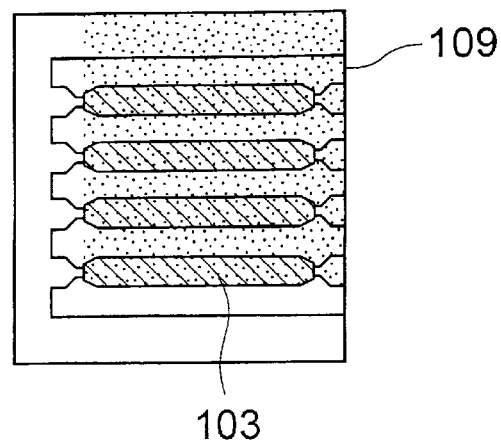

FIGS. 9A and 9B are a perspective view and a plan view showing a piezoelectric actuator of the present Embodiment, respectively, and FIGS. 10A and 10B are plan views showing applying patterns of electroconductive material for forming a common electrode and an individual electrode, respectively.

A piezoelectric actuator 140 of the present Embodiment has four long and narrow driving columns 142 in a row parallel to one another. The driving column 142 has a displacement output surface 141 on the upper surface expanding and contracting in the vertical direction when the electrical field is applied. The width of the driving column 142 widens, the same as the above driving column 108, from the displacement output surface to the bottom of the driving column 142.

The displacement output surface 141 comprises an active region 146 and an inactive region 145 similar to the Embodiment 1. The sectional shape of the driving column has a narrowed part 149a, 149b at the boundary between the active region 146 and the inactive region 145 (refer to FIG. 11B).

The planar shape of the piezoelectric actuator 140 is comb-teeth-like (refer to FIG. 9C), and a layered common electrode layer 140a similar to the above layered common electrode layer 16f forming one edge of each driving column is consecutively formed in a row and the respective edges of the common electrodes are consecutively bonded at the layered common electrode layer 140a.

The width of the active region 146 is 0.12 mm, the longitudinal length of the active region 146 is 1.6 mm, the pitch is 0.34 mm, and the height is about 0.6 mm.

A method for manufacturing the piezoelectric actuator will be hereinafter described.

In the present Embodiment, a green sheet consisting of lead zirconate-titanate based ceramics which is piezoelectric material and an organic binder having a thickness of 50 micrometers was employed similar to Embodiment 1. Five sheets having the common electrode 102 made of silver-palladium paste and five sheets having the individual electrode 103 were alternately layered, and further a sheet having no internal electrode was layered to make a layered member 150. FIGS. 10A and 10B are horizontal sectional views showing the shapes of the common electrode and the individual electrode of the layered member 150, respectively. For the purpose of the clear description, the regions corresponding to the active region 145 and the inactive region 146 are designated by solid lines in FIG. 10. The common electrode and the individual electrode have patterned shapes illustrated in FIGS. 10A and 10B, and the electrical connection of both of the individual electrode 103 and the common electrode 102 could be performed on the external electrode taken-out surface 109.

Then, similar to the Embodiment 1, the processing of the groove 147 for forming the driving column 42 employing a sandblast method was conducted according to the following description.

On the displacement output surface 141 was formed a comb-teeth like pattern mask 112 having narrowed parts 149a,149b at the boundary between the active region 146 and the inactive region 145 of the displacement output surface 141 and the groove 147 formed form the edge to the halfway along the longitudinal direction of the displacement output surface 141. Thereafter, similar to the steps of the Embodiment 1 shown in FIGS. 5B and 5C, the four driving columns 142 were made by processing the five grooves 147. The width of the active region 146 was 0.12 mm and the narrowest width of the narrowed part 149 (refer to FIG. 9B) was about 0.05 mm. The groove 147 was formed by penetrating itself into the inactive region 145a by 0.3 mm from the boundary between the active region 146 and the inactive region 15a, and the groove 147 was also formed at the layered individual electrode side.

The external electrode of the present Embodiment was formed only on the external electrode taken-out surface 109 to which the edge of the individual electrode 103 was exposed. The displacement output surface 141 had a comb-teeth like shape connected by the layered common electrode layer 140a similar to the Embodiment 1, and the supply of electricity of each driving column 142 to the common electrode 102 was secured. Accordingly, the application of the silver paste onto the outer side surface of the layered common electrode layer 140a was no longer necessary to largely reduce the manufacturing cost compared with the Embodiment 1.

Experimental Example 1 for Confirming Performance

The FPC cable 125 was thermally connected under pressure similar to the Embodiment 1. When the actuator was driven by means of the voltage of which a wave shape was shown in FIG. 7d, all the driving columns 142 outputted a displacement of about 0.2 micrometers. The ink jet head similar to that of FIG. 8 was manufactured employing the above actuator and was incorporated into a ink jet type recording apparatus. In this apparatus, all the nozzles 121 stably ejected ink drops.

Modified Example of Embodiment 2

While the four driving column 1142 were arranged in a row in the piezoelectric actuator 116 in the Embodiment 2, two rows of the driving columns 142 were arranged in this Modified Example. The description of the same members as those of the Embodiment 2 will be omitted by affixing the same numerals thereto. The piezoelectric actuator 154 having four driving columns 142 per row was manufactured similarly to Embodiment 2 and evaluated.

Figure 11A:
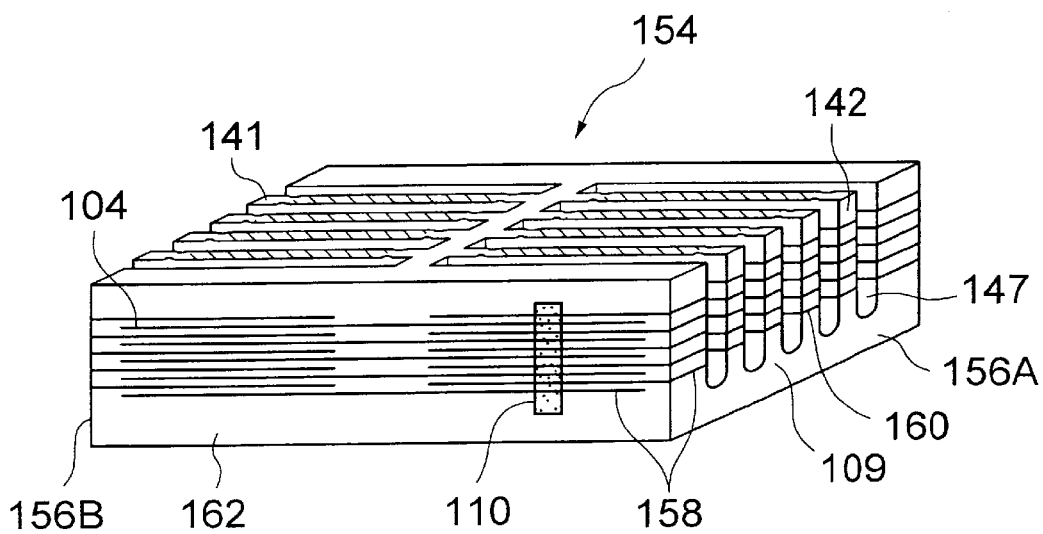
FIGS. 11A and 11B are a perspective view and a plan view showing a piezoelectric actuator of Modified Example, respectively.
Figure 11B:
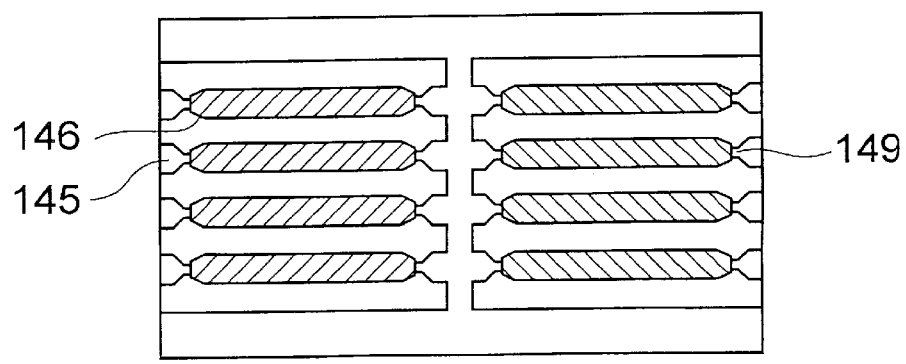

FIGS. 11A and 11B are a perspective view and a plan view showing the piezoelectric actuator of the present Modified Example, respectively.

The piezoelectric actuator 154 of the present Modified Example had a driving column and a peripheral column having the same shapes as those of the driving column 142 and the peripheral column 116c, respectively, at the positions symmetrical to the driving column 142 and the peripheral column 116c on the outer side surface of the piezoelectric actuator portion 140a.

Figure 12A:
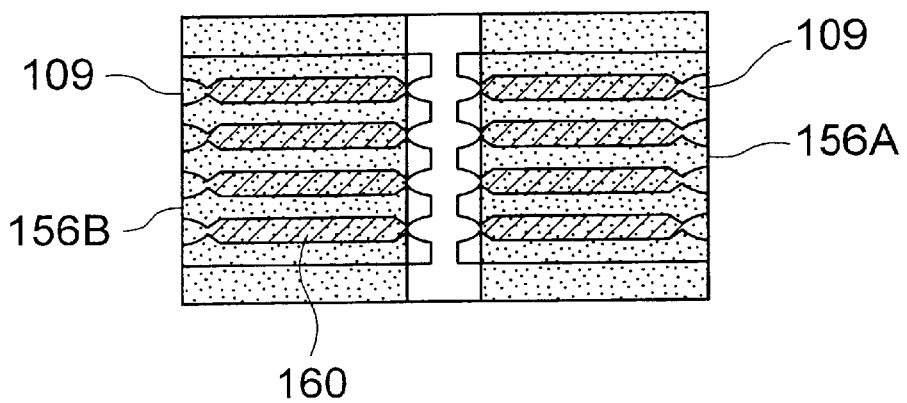
FIGS. 12A and 12B are plan views showing an applying pattern of electroconductive material for a common electrode and an individual electrode in Modified Example, respectively.
Figure 12B:
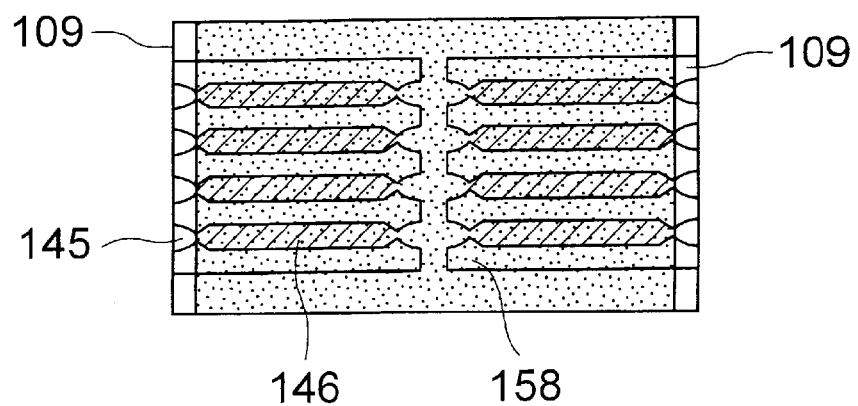

In case of manufacturing the piezoelectric actuator 154 of the present Modified Example, the external electrodes were formed on the external electrode taken-out surface 109 similar to the Embodiment 2 by making the two side surfaces 156A,156B perpendicular to the driving column 142 among the side surfaces of the piezoelectric actuator 116c function as the external electrode taken-out surface 108 so as to form the two rows of the driving columns 142. However, the patterned planar shape of electroconductive material forming the common electrode 158 and the individual electrode 160 applied on the green sheet had those shown in FIGS. 12A and 12B, different from the Embodiment 2.

The piezoelectric actuator 154 was manufactured by conducting the same steps as those of Embodiment 2 followed by applying electroconductive paste 110 onto one side surface 162 (refer to FIG. 11B) of the side surfaces of the layered member parallel to the driving column 142 and electrically connecting with the electroconductive material applied on the green sheet when the common electrode 158 and the individual electrode 160 had been formed. Then, the common electrode 158 and the individual electrode 160 of each driving column were connected with the respective external powers on one side surface of the external electrode taken-out surface 109.

Experimental Example 2 for Confirming Performance

Figure 13:
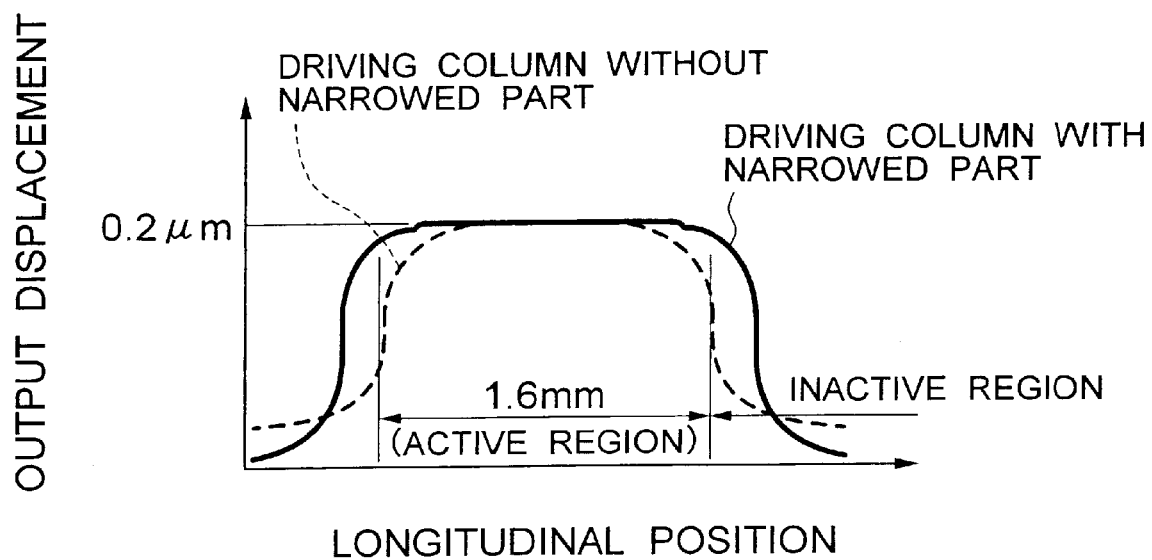
FIG. 13 is a graph showing a displacement change of a piezoelectric actuator.

The narrowed part was formed at the boundary between the active region 146 and the inactive region 145 of the displacement output surface 141 in the Embodiment 2. The graph of FIG. 13 compares the measured longitudinal displacement distributions between the driving column 142 of the Embodiment 2 or the Modified Example and the driving column 108 having no narrowed part. The restriction of the displacement of, especially the active region portion around the boundary hereinafter referred to as boundary active region portion), was lightened in the piezoelectric actuators 40,54 having the narrowed part 149 so that the output displacement of the boundary active region portion approached near the output displacement of the central active region portion as shown in FIG. 13. An amount of area change obtained by integrating the output displacement along the longitudinal direction of the displacement output surface 141 increased by about 20%, and the maximum voltage (refer to FIG. 7) required for ejecting the ink drops could be reduced to about 85% compared with the recording apparatus employing the driving column 108 without the narrowed part 149 so as to reduce the consumption power of the piezoelectric actuators 40,54.

Experimental Example Concerning Narrowed Part

In order to obtain the relation between the width of the narrowest portion of the narrowed part 149 and the efficiency of the output displacement, an experiment was attempted. As a result, in case of forming the narrowed part having the narrowest width B (FIG. 9B) exceeding about 0.09 mm, the effect of reducing the restriction of the active region 146 was scarcely obtained. On the other hand, the stable formation of the narrowest part having a width of 0.03 mm or less was hardly conducted using the sandblast method of Embodiment 1 and 2 and Modified Examples. In view of the above results, it is understandable that the narrowest width of the narrowed part 149 is formed between 0.03 mm and 0.09 mm, and more preferably between 0.03 mm and 0.05 mm.

Experimental Example 3 for Confirming Performance

The ink jet head having two rows of nozzles each row having for nozzles was manufactured employing the above actuator 154 similar to the Embodiment 2, and a voltage was applied to the piezoelectric actuator 154 through the FPC cable 125. All the eight nozzles could stably eject the ink drops.

Although the piezoelectric actuator 116 was manufactured in which the number of rows was 1 or 2 and the four driving columns 108 were arranged on one row in the Embodiment 1 and 2 and the Modified Example, another piezoelectric actuator having the lager number of the driving columns per one row depending on the desired number of nozzles of the ink jet head can be similarly manufactured.

Since the above embodiments are described only or examples, the present invention is not limited to the above embodiments, and various modifications or alternations can be easily made therefrom by those skilled in the art without departing from the scope of the present invention.

What is claimed is:

1. A piezoelectric actuator comprising a substrate and a plurality of driving columns extending parallel to one another and separated by grooves on said substrate, said plurality of driving columns having an active region in a central portion thereof, which is formed by a layered electrode structure including common electrode layers and individual electrode layers alternately layered employing green sheets made of piezoelectric material, and a displacement output surface externally outputting the displacement produced by the piezoelectric effect of said active region on an upper surface of said driving column opposite to said substrate, wherein a width of each driving column in the direction of said groove increases from said displacement output surface to said substrate.

2. The piezoelectric actuator as defined in claim 1, further comprising an inactive region comprising peripheral edge regions disposed on opposite sides of said active region, wherein one of said peripheral edge regions is formed by a layered common electrode layer consisting of common electrodes only, and an opposite one of said edge regions is formed by a layered individual electrode layer consisting of individual electrodes only, and each of said peripheral edge regions serving as said inactive region.

3. The piezoelectric actuator as defined in claim 2, wherein the shape of each of said driving columns is a transversal sectional shape running parallel to said grooves, and wherein outer portions of said active region, which contact said peripheral edge regions of said inactive region, are narrowed with respect to a center part of said active region.

4. The piezoelectric actuator as defined in claim 3, wherein the transversal sectional shape of said driving columns has a narrowed part at an interface between said active region and said inactive region.

5. The piezoelectric actuator as defined in claim 1, wherein said common electrode layers and said individual electrode layers of said driving columns are connected to an external power at one edge portion along said grooves, and said common electrode layers are electrically connected at an opposite edge portion.

6. The piezoelectric actuator as defined in claim 1, further comprising a bonding wall integrally formed with ends of one side of said plurality of driving columns in a direction perpendicular to said groove, wherein the respective edge portions of said common electrode layers are electrically connected to said bonding wall.

7. The piezoelectric actuator as defined in claim 1, wherein said piezoelectric actuator is that for an ink jet head, and each driving column functions as a driving mechanism for ejecting ink from an ink nozzle of an ink jet head.

* * * * *